United States Patent [19]

Suzuki

[11] 4,280,977

[45] Jul. 28, 1981

[54] METHOD OF WORKING CERAMIC GREEN SHEET

[75] Inventor: Go Suzuki, Nagoya, Japan

[73] Assignee: NGK Insulators, Ltd., Japan

[21] Appl. No.: 123,404

[22] Filed: Feb. 21, 1980

Related U.S. Application Data

[63] Continuation of Ser. No. 935,881, Aug. 23, 1978, abandoned, which is a continuation of Ser. No. 800,424, May 25, 1977, abandoned.

[30] Foreign Application Priority Data

Jun. 3, 1976 [JP] Japan .................................. 51-04055

[51] Int. Cl.³ ............................................. B29C 17/10
[52] U.S. Cl. ..................................... 264/153; 264/156
[58] Field of Search .................... 264/153, 67, 62, 156, 264/61

[56] References Cited

U.S. PATENT DOCUMENTS

| | | | |
|---|---|---|---|
| 2,335,665 | 3/1941 | Bauer | 264/62 |
| 3,074,143 | 1/1963 | Smith | 264/62 |
| 3,234,593 | 2/1966 | Lerner | 264/153 |

*Primary Examiner*—John Parrish
*Attorney, Agent, or Firm*—Stevens, Davis, Miller & Mosher

[57] ABSTRACT

A method of working ceramic green sheet is disclosed. The ceramic green sheet is worked by pushing a spacer having at its edge a given profile to the surface of the sheet and then forcing a cylindrical knife heated at a given temperature and provided with an edge having a form substantially equal to the profile of the spacer along the periphery of the spacer to the surface of the sheet.

8 Claims, 2 Drawing Figures

METHOD OF WORKING CERAMIC GREEN SHEET

This is a continuation of application Ser. No. 935,881 filed Aug. 23, 1978 now abandoned which in turn is a continuation of Ser. No. 800,424 filed May 25, 1977 now abandoned.

BACKGROUND OF THE INVENTION

1. Field of the Invention

The present invention relates to a method of working ceramic green sheet.

2. Description of the Prior Art

In general, ceramic substrate are used as packages for integrated circuit and other electronic parts in electronic watch and the like, and manufactured by printing a desired pattern on flexible ceramic green sheets composed mainly of alumina and a binder with a metallizing paste, laminating these printed green sheets one upon another, bonding the laminate as a whole under heating and pressing, punching the laminate into a desired form by means of a punching machine and then firing the punched portions in a reducing atmosphere.

However, this conventional method has such drawbacks that the production steps are complicated because the punching is carried out after the heat and press-bonding of the laminate and that it is very difficult to accurately and sharply punch the laminate owing to the use of the punching machine.

SUMMARY OF THE INVENTION

An object of the present invention is to solve the above mentioned drawbacks of the prior art in the working of the ceramic green sheet.

According to the present invention, there is provided a method of working ceramic green sheet, which comprises pushing a spacer having at its edge a given profile to a surface of the ceramic green sheet, and forcing a cylindrical knife heated at a given temperature and provided with an edge having a form equal or substantially equal to the profile of the spacer edge along the periphery of the surface of the ceramic green sheet.

BRIEF DESCRIPTION OF THE DRAWINGS

The invention will be described in greater detail with reference to the accompanying drawings, wherein.

DESCRIPTION OF THE PREFERRED EMBODIMENT

Figure 1:
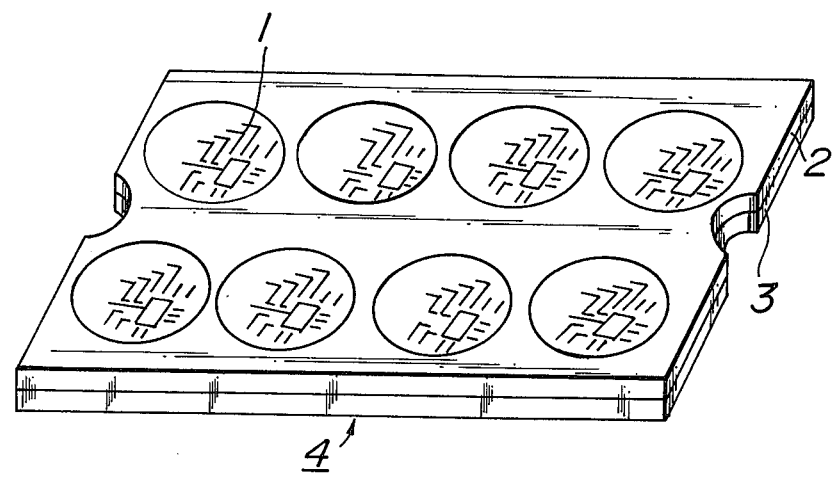
FIG. 1 is a perspective view of an embodiment of ceramic green sheet used for carrying out the present invention.
Figure 2:
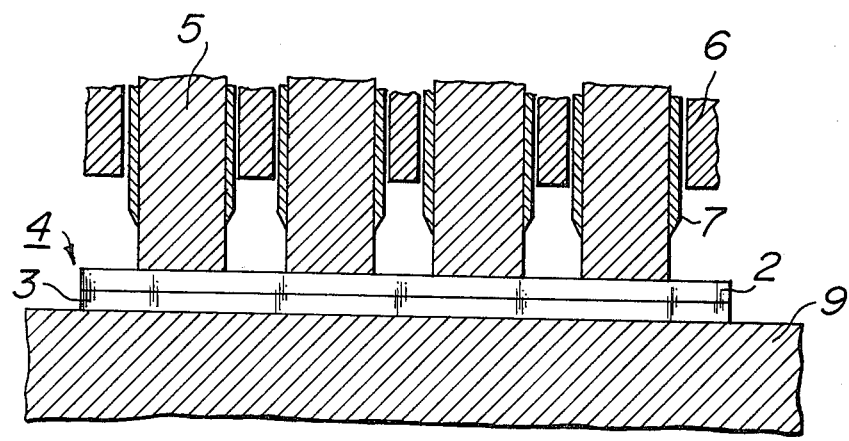
FIG. 2 is a schematically illustrative view partly shown in section of an embodiment of the apparatus for carrying out the present invention.

The method of working ceramic green sheet according to the present invention will be described in more detail with reference to the example shown in the drawings.

In order to shape a plurality of ceramic packages for integrated circuit used in the electronic watch at once, as shown in FIG. 1, a plurality of patterns 1 corresponding to electrode arrangement of the integrated circuit are printed on ceramic green sheets 2, 3 with a metallizing ink and then the printed green sheets 2, 3 are placed one upon another while matching the patterns 1 printed on each sheet to form a laminate 4. The sheet is made of alumina powder bound by 5-10% by weight of PVB (polyvinyl butyral). Next, the laminate 4 is put on a base 9 and then spacers 5 protruded from a jig 6 are pushed to the top surface of the laminate 4 in such a manner that spacers 5 match the positions of the patterns 1. In this case, the edge surface of the spacer 5 has a profile similar to a profile of an objective final product but slightly larger than the size of the final product. The spacer 5 is preferably heated at a temperature enough to soften the binder contained in the ceramic green sheet but not to decompose the binder., e.g. 60°-150° C., preferably 80°-120° C. Under such circumstances, a cylindrical knife 7 heated at a given temperature, e.g. 60°-150° C., preferably 80°-120° C., and provided with an edge having a form equal or substantially equal to the profile of the spacer 5 is pushed to the top surface of the laminate 4 along the periphery of the spacer 5. Then, the edge of the knife 7 is forced into the green sheets of the laminate 4, whereby a plurality of laminated sections corresponding to the final product are obtained. These sections are fired in a reducing atmosphere to produce ceramic packages for integrated circuit in electronic watch.

Moreover, when the ceramic green sheet is used as a single layer rather than the laminate, the heating of the spacer 5 is not necessary and only the knife 7 is heated at a given temperature.

According to the present invention, not only the cut surface of the sections is accurate and sharp, but also the production step is considerably simplified due to the absence of heat and press-bonding step when the ceramic green sheets are laminated, so that the quality of the product becomes stable and the cost is considerably decreased. Accordingly, the present invention has a great merit in industry.

What is claimed is:

1. A method of working ceramic green sheet, comprising pushing a spacer having at its edge a given profile to a surface of the ceramic green sheet and then forcing a cylindrical knife heated at a temperature of 60°-150° C. and provided with an edge having a form substantially equal to the profile of the spacer edge along the periphery of the spacer into the ceramic green sheet.

2. A method as claimed in claim 1, wherein the ceramic green sheet is a laminate composed of a plurality of ceramic green sheets.

3. A method as claimed in claim 2, wherein the spacer is heated at a given temperature.

4. A method as claimed in claim 1, wherein the knife is heated at a temperature of 80°-120° C.

5. A method as claimed in claim 3, wherein the spacer is heated at a temperature of 60°-150° C.

6. A method as claimed in claim 3, wherein the spacer is heated at a temperature of 80°-120° C.

7. A method of working ceramic green sheet having a plurality of electronic circuit patterns printed thereon to provide sections of said sheet, each section containing one of said patterns, comprising:

pushing a spacer to the surface of each part of said green sheet on which one of said patterns is located, and then forcing a heated cylindrical knife at a temperature of 60°-150° C. which surrounds said spacer toward said green sheet to cut said part from said sheet to form a section of green sheet having one of said patterns located thereon.

8. A method for making ceramic substrates for integrated circuits and other electronic components, comprising:

printing, with metallizing ink, a plurality of patterns on a ceramic green sheet, each pattern corresponding to the electrode arrangement of an integrated circuit or other electronic component, placing the printed green sheet on a base, bringing an array of spacers to the surface of the printed green sheet, each spacer being of such a size and being so positioned as to mask one of the patterns on the printed green sheet, guiding an array of heated cylindrical cutters at a temperature of 60°–150° C. toward and into said printed green sheet by means of said spacer array, each of said cutters surrounding and moving along one of the spacers of the spacer array thereby cutting disc-shaped sections from said printed green sheet, each section having one of the printed patterns thereon, and then firing the sections so obtained.

* * * * *